United States Patent
Xu et al.

(10) Patent No.: US 9,012,270 B2
(45) Date of Patent: Apr. 21, 2015

(54) METAL LAYER ENABLING DIRECTED SELF-ASSEMBLY SEMICONDUCTOR LAYOUT DESIGNS

(71) Applicants: Ji Xu, Watervliet, NY (US); Vito Dai, Santa Clara, CA (US)

(72) Inventors: Ji Xu, Watervliet, NY (US); Vito Dai, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/832,442

(22) Filed: Mar. 15, 2013

(65) Prior Publication Data
US 2014/0264461 A1  Sep. 18, 2014

(51) Int. Cl.
*H01L 27/02* (2006.01)
*H01L 21/768* (2006.01)
*H01L 23/535* (2006.01)

(52) U.S. Cl.
CPC ........ *H01L 21/76895* (2013.01); *H01L 23/535* (2013.01)

(58) Field of Classification Search
CPC .................. H01L 27/11898; H01L 2924/14; H01L 27/0207; H01L 24/06; H01L 23/50
USPC .......... 257/202–211; 438/128, 129, 309, 587, 438/598
See application file for complete search history.

(56) References Cited

U.S. PATENT DOCUMENTS

2013/0026571 A1*  1/2013  Kawa et al. .................. 257/347
2013/0078576 A1*  3/2013  Wu et al. ...................... 430/296

OTHER PUBLICATIONS

Chang et al., Center for Integrated Systems, Department of EE and Materials Science and Eng., Stanford University, "Diblock Copolymer Directed Self-Assembly for CMOS Device Fabrication" Design and Process Integration for Microelectronics Manufacturing IV, Proc. of SPIE vol. 6156, pp. 615611-1 to 615611-6.*
Joy Y. Cheng et al., "Simple and Versatile Methods to Integrate Directed Self-Assembly with Optical Lithography Using a Polarity-Switched Photoresist," Published online Jul. 15, 2010, American Chemical Society, vol. 4, No. 8, pp. 4815-4823.
He Yi et al., "Flexible Control of Block Copolymer Directed Self-Assembly using Small, Topographical Templates: Potential Lithography Solution for Integrated Circuit Contact Hole Patterning," Adv. Mater. 2012, 2012 WILEY-VCH Verlag GmbH & Co. KGaA, Weinheim, pp. 1-8.
Mark P. Stoykovich et al., "Block copolymers and conventional lithography," Materials Today, Sep. 2006, vol. 9, No. 9, pp. 20-29.

(Continued)

*Primary Examiner* — Steven Loke
*Assistant Examiner* — Didarul Mazumder
(74) *Attorney, Agent, or Firm* — Ditthavong & Steiner, P.C.

(57) ABSTRACT

Methods for forming a DSA pre-patterned semiconductor transistor layout and the resulting devices are disclosed. Embodiments may include forming a pre-patterned transistor layout by directed self-assembly (DSA), forming a metal layer over the DSA pre-patterned transistor layout, including: forming a plurality of horizontal metal lines; and forming a plurality of vertical metal segments discontinuous from and between adjacent horizontal metal lines; and forming one or more bridging dots each connecting one of the plurality of horizontal metal lines to one of the plurality of vertical metal segments, wherein locations of the bridging dots determine logic functions of resulting transistor cells.

11 Claims, 14 Drawing Sheets

(56) References Cited

OTHER PUBLICATIONS

Mark P. Stoykovich et al., "Directed Self-Assembly of Block Copolymers for Nanolithography: Fabrication of Isolated Features and Essential Integrated Circuit Geometries," Published online Oct. 6, 2007, American Chemical Society, pp. 168-175.

Ji Xu et al., "Directed Self-Assembly of Block Copolymers on Two-Dimensional Chemical Patterns Fabricated by Electro-Oxidation Nanolithography," Adv. Mater. 2010, 2010 WILEY-VCH Verlag GmbH & Co. KGaA, Weinheim, pp. 2268-2272.

Li-Wen Chang et al., "Experimental Demonstration of Aperiodic Patterns of Directed Self-Assembly by Block Copolymer Lithography for Random Logic Circuit Layout," Applied Materials, Sunnyvale, CA 94085, USA, pp. 33.2.1-33.2.4.

Chi-Chun Liu et al., "Fabrication of Lithographically Defined Chemically Patterned Polymer Brushes and Mats," American Chemical Society: Macromolecules 2011, vol. 44, Mar. 18, 2011, pp. 1876-1885.

Guoliang Liu et al., "Integration of Density Multiplication in the Formation of Device-Oriented Structures by Directed Assembly of Block Copolymer—Homopolymer Blends," Adv. Funct. Mater. 2010, vol. 20, 2010 WILEY-VCH Verlag GmbH & Co. KGaA, Weinheim; pp. 1251-1257.

Seong-Jun Jeong et al., "Soft Graphoepitaxy of Block Copolymer Assembly with Disposable Photoresist Confinement," American Chemical Society, Publication Date (Web): May 7, 2009; pp. 1-7.

* cited by examiner

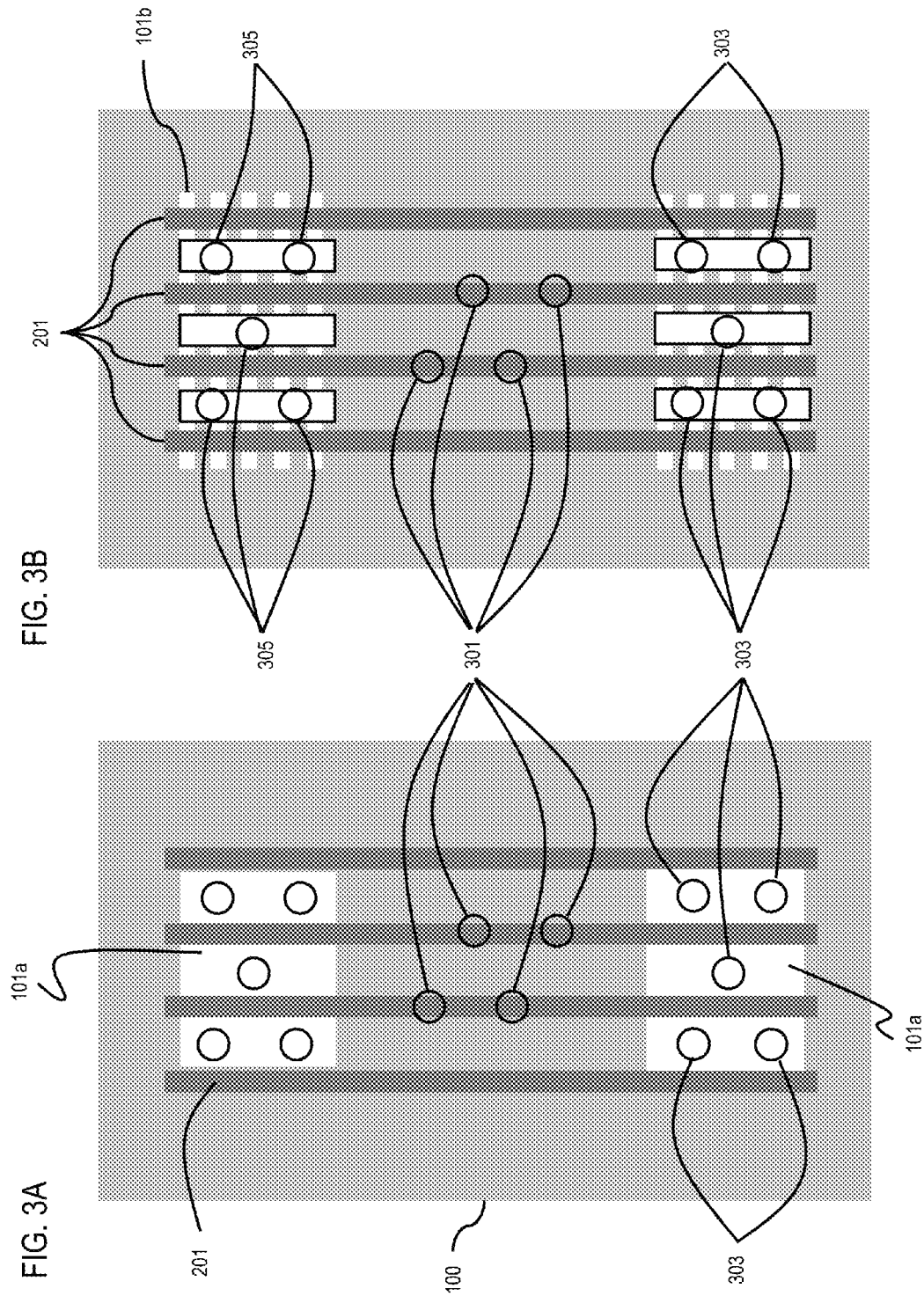

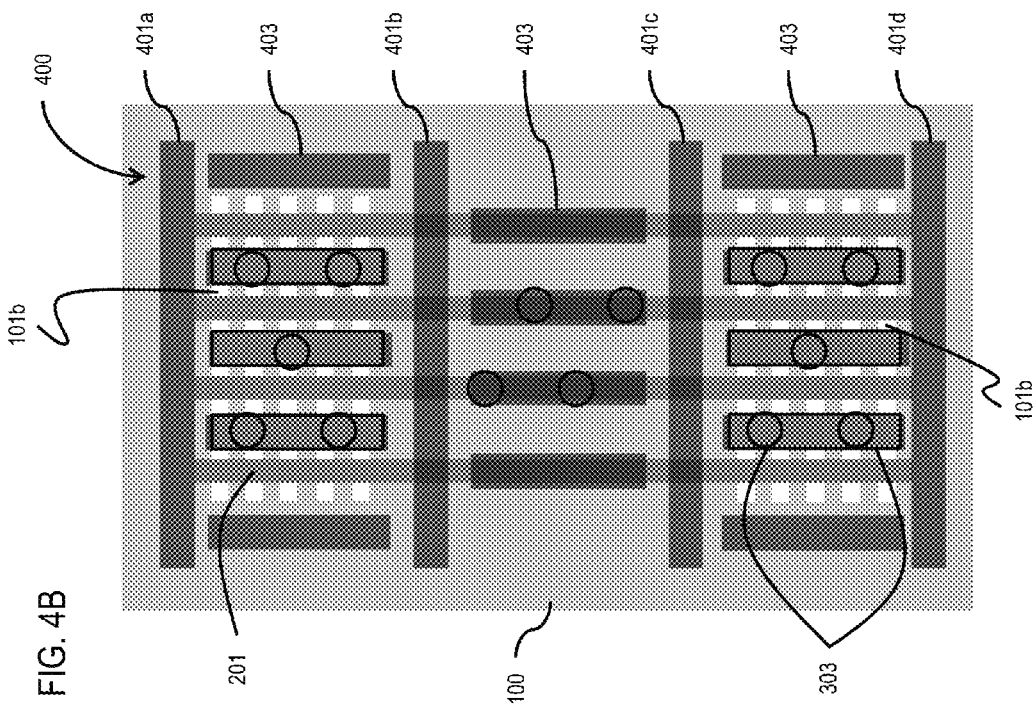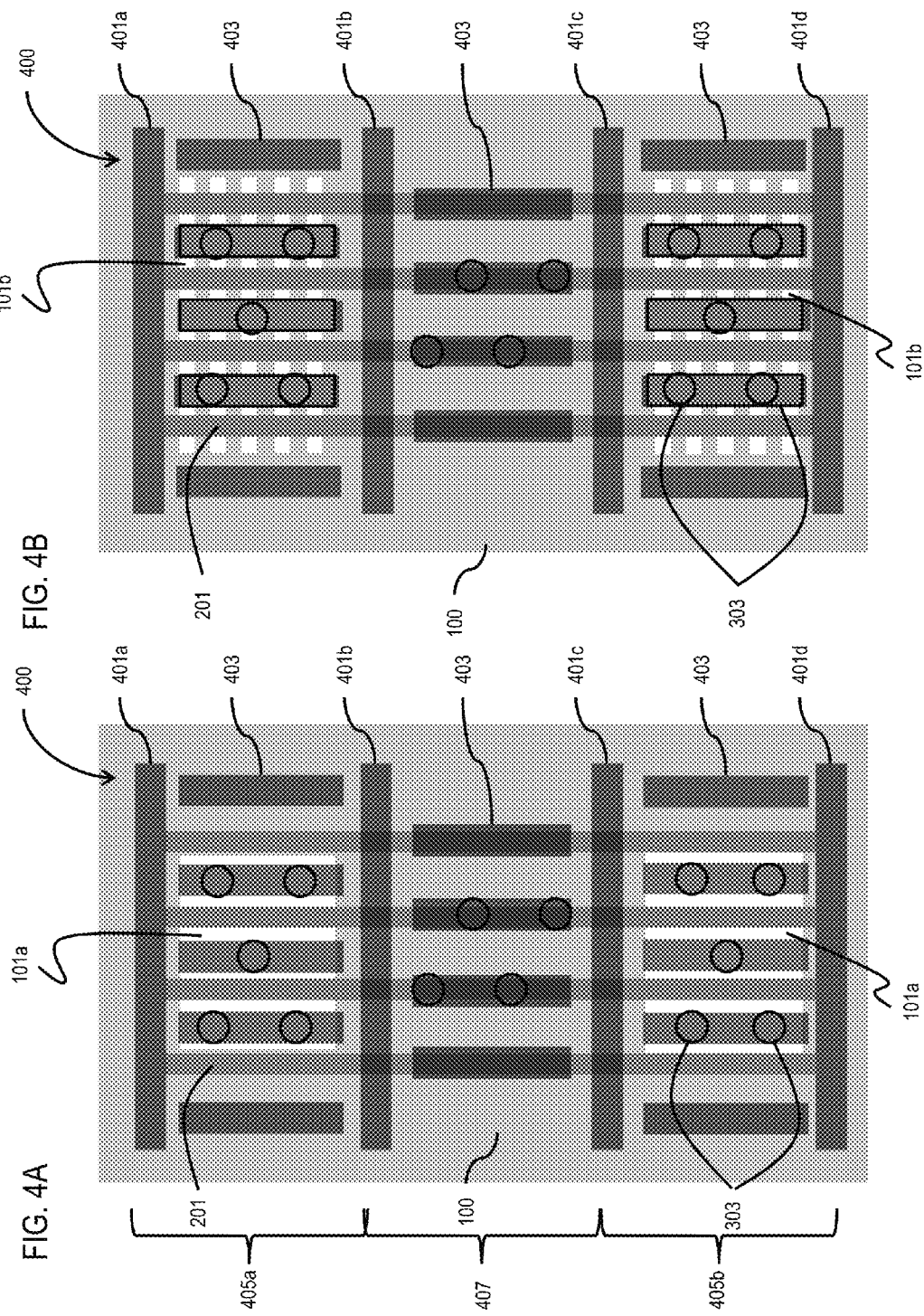

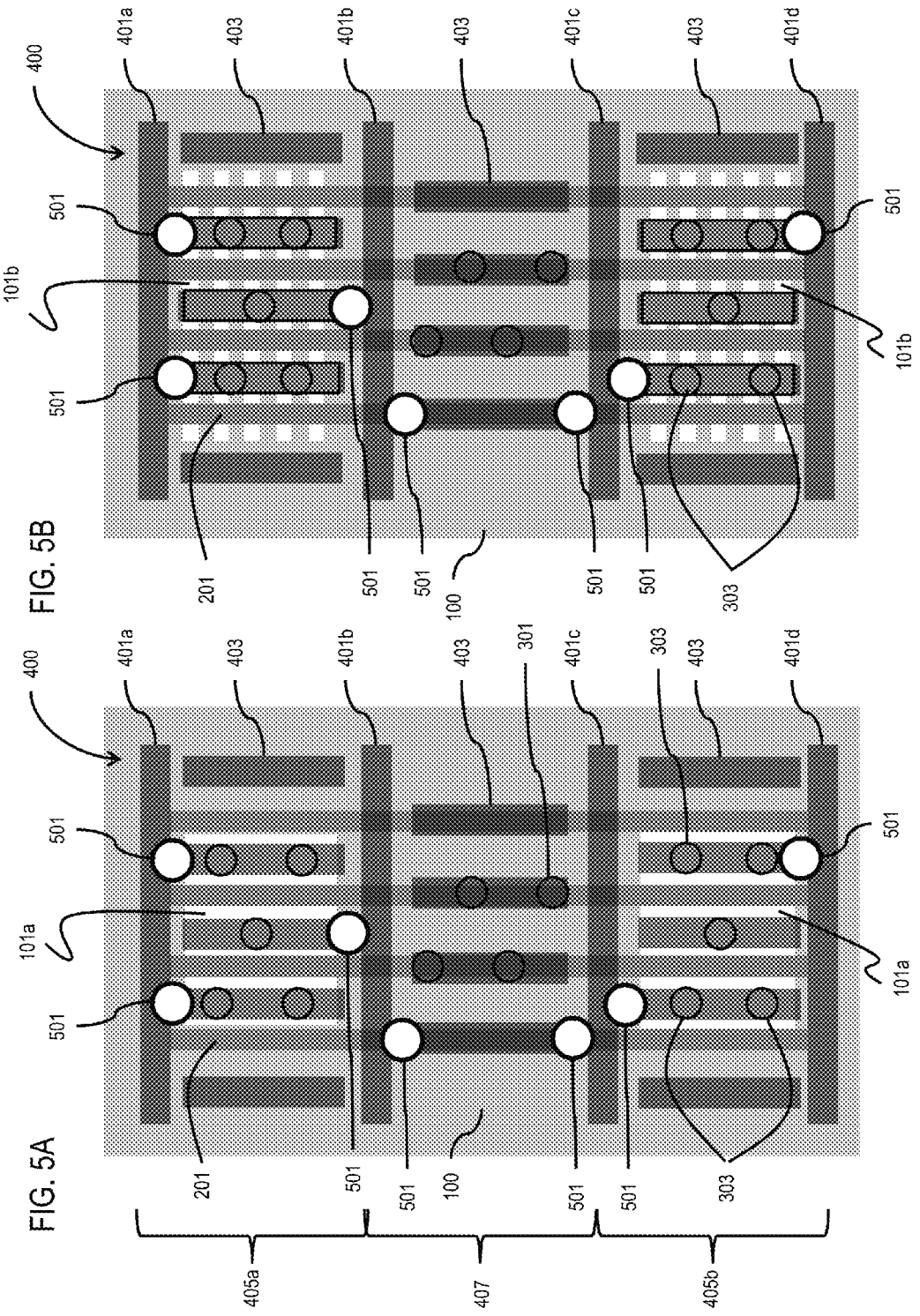

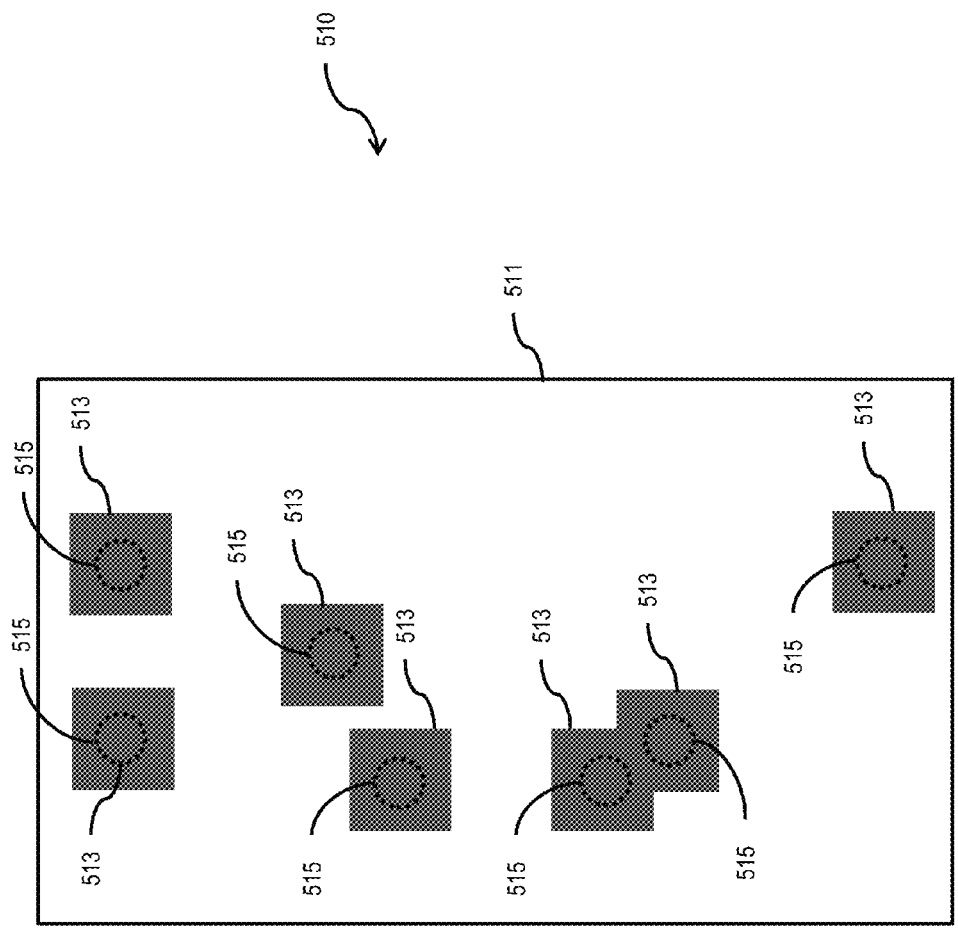

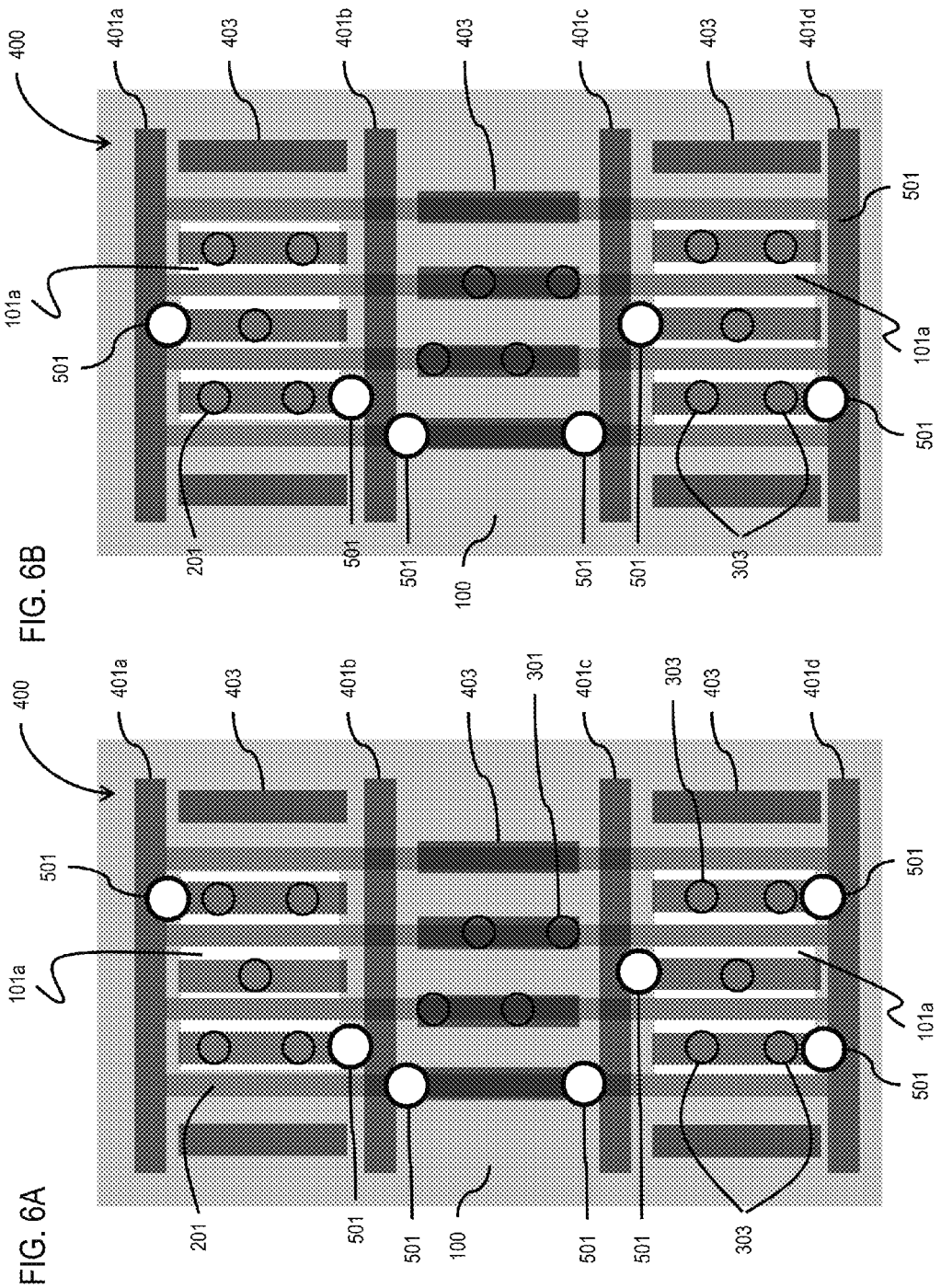

METAL LAYER ENABLING DIRECTED SELF-ASSEMBLY SEMICONDUCTOR LAYOUT DESIGNS

TECHNICAL FIELD

The present disclosure relates to semiconductor layout designs. The present disclosure is particularly applicable to forming semiconductor layout designs for 20 nanometer (nm) technology nodes and beyond, and the resulting devices.

BACKGROUND

Current and future state-of-the-art integrated circuit (IC) manufacturing technologies demand the capability to fabricate features with a pitch below 60 nm. Currently developed photolithography tools, however, are limited to patterning a single pitch not less than 80 nm. A key to future-generation lithography for IC manufacturing is to inexpensively deploy tools and enable processes to efficiently pattern smaller features with smaller pitches. Several solutions have been proposed for manufacturing ICs below 60 nm.

One solution is extreme ultraviolet (EUV) lithography that utilizes a 13.5 nm wavelength light source for use in 20 nm technology nodes and beyond (e.g., 14 nm). However, EUV lithography is difficult to implement because it requires a stable and powerful light source of EUV light. Thus, wafer throughput is very low compared to current standards. Further, because all matter absorbs EUV light, reflective lenses (e.g., mirrors) must be used in design tools instead of refractive lenses. This imposes an extremely restricted requirement on the flatness of the mirrors, which poses a large technical challenge. The absorption of EUV light by all matter also demands a high vacuum environment and an ultra-clean manufacturing practice throughout the entire supply chain, which significantly increases cost.

Another solution involving spacer or sidewall technology is based on currently employed optical lithography and uses a series of deposition and etching processes to convert a mandrel structure into two separated structures on the sides. Hence, the solution allows for doubling the density and splitting the pitch of features by a factor of two. However, the extra deposition and etching increases the complexity of the process and the manufacturing cost and is still difficult to extend to even smaller size features.

Another solution is double patterning technology that involves multiple optical lithography processes to double the density of features. However, similar to the second solution above, the double patterning increases the cost for the extra processing steps and has challenges concerning mask overlay issues.

Another solution is directed self-assembly (DSA) that uses the self-assembling capability of block copolymers (BCPs) to obtain periodic nano-features on a surface patterned with chemical functionalities or topographies, such as chemical epitaxy or graphoepitaxy, respectively. The BCP self-assembles to form micro-phase separated structures, where the relative length of the polymer chain for either block determines the morphology the material will adopt. With the desired morphology and orientation, the patterns formed by the BCPs can be transferred onto a substrate (e.g., a layer associated with the production of a semiconductor device) through several steps associated with BCP lithography. Structures can be formed using the BCP, such as cylinders or lamellae, which can then be transferred through reactive ion etching to a substrate. For graphoepitaxy, a neutral surface in combination with topographical features controls the location and orientation of the BCP microdomains. For chemical epitaxy, a neutral surface in combination with chemical pinning regions controls the location and orientation of the BCP microdomains. After application of the BCPs to the topographically or chemically patterned surfaces, thermal or solvent annealing methods separate the BCPs into the microdomains.

DSA is based on current state-of-the-art 193 nm immersion lithography with a few additional processing steps that are compatible with current manufacturing flows. Every DSA-associated processing step can be implemented within one to several minutes allowing for throughput to be analogous to current 193 nm lithography flow. However, although individual process steps have been shown using DSA-implemented technologies, it has not been shown how DSA structures can be designed to print a layout of complementary metal-oxide semiconductor (CMOS) standard transistor cells, or how exactly a layout should be designed to enable DSA.

A need therefore exists for methodology enabling fabrication of a DSA standard cell design and the resulting cell design.

SUMMARY

An aspect of the present disclosure is a method for forming a standard transistor layout using DSA pre-patterns and a standard metal layer.

Another aspect of the present disclosure is a device with a standard transistor layout formed by DSA pre-patterns and a standard metal layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a pre-patterned transistor layout by DSA; forming a metal layer over the DSA pre-patterned transistor layout, including: forming a plurality of horizontal metal lines; and forming a plurality of vertical metal segments discontinuous from and between adjacent horizontal metal lines; and forming one or more bridging dots each connecting one of the plurality of horizontal metal lines to one of the plurality of vertical metal segments, wherein locations of the bridging dots determine logic functions of resulting transistor cells.

An aspect of the present disclosure includes the plurality of horizontal metal lines separating the transistor layout into p-type field effect transistor (p-FET) regions, n-type field effect transistor (n-FET) regions, and input/output regions. Another aspect includes dividing the plurality of horizontal metal lines into groups of at least four horizontal metal lines, each group including a power line and a ground line, and intra-cell routing and output metal lines therebetween. Additional aspects include forming the power line and the output metal line on opposite sides of a p-FET/n-FET region in the transistor layout, and forming the ground line and the intra-cell routing line on opposite sides of an n-FET/p-FET region in the transistor layout. Further aspects include forming a first row of the plurality of vertical metal segments aligned with gates within the transistor layout, and forming second rows of the plurality of vertical metal segments on opposite sides of and adjacent to the first row, the vertical metal segments of the second rows being misaligned with the gates within the transistor layout. An additional aspect includes forming the plurality of horizontal metal lines and the plurality of vertical metal segments through DSA chemical epitaxy with lamellae-forming block copolymers. Another aspect includes forming the bridging dots above the metal layer through DSA graphoepitaxy with cylinder and/or sphere-forming block copolymers. Other aspects include forming holes within the metal layer by ultra high-resolution lithography corresponding to the locations of the bridging dots; and filling the holes with metal forming the bridging dots within the metal layer.

Another aspect of the present disclosure is a device including: a pre-patterned transistor layout formed by DSA; a metal layer over the DSA pre-patterned transistor layout, including: a plurality of horizontal metal lines; and a plurality of vertical metal segments discontinuous from and between adjacent horizontal metal lines; and one or more bridging dots each connecting one of the plurality of horizontal metal lines to one of the plurality of vertical metal segments, wherein locations of the bridging dots determine logic functions of resulting transistor cells.

An aspect includes the plurality of horizontal metal lines separating the transistor layout into p-FET regions, n-FET regions, and input/output regions. Further aspects include the plurality of horizontal metal lines divided into groups of at least four horizontal metal lines, each group including a power line and a ground line, and intra-cell routing and output metal lines therebetween. Additional aspects include the power line and the output metal line being on opposite sides of a p-FET/n-FET region in the transistor layout; and the ground line and the intra-cell routing line on opposite sides of an n-FET/p-FET region in the transistor layout. Further aspects include a first row of the plurality of vertical metal segments being aligned with gates within the transistor layout; and second rows of the plurality of vertical metal segments being on opposite sides of and adjacent to the first row, the vertical metal segments of the second rows being misaligned with the gates within the transistor layout. Another aspect includes the plurality of horizontal metal lines and the plurality of vertical metal segments being formed through DSA chemical epitaxy with lamellae-forming block copolymers. A further aspect includes the bridging dots being formed above the metal layer through DSA graphoepitaxy with cylinder and/or sphere-forming block copolymers. Yet another aspect includes the bridging dots being formed within the metal layer by ultra high-resolution lithography.

Another aspect of the present disclosure is a method including: forming a pre-patterned transistor layout, including: forming transistors over an active region in a substrate through DSA chemical epitaxy of a block copolymer; and forming contacts extending up from the active region and the transistors through DSA graphoepitaxy of the block copolymer; forming a metal layer over the transistors and connected to the contacts, including: forming a plurality of horizontal metal lines; and forming a plurality of vertical metal segments discontinuous from and between adjacent horizontal metal lines; and forming one or more bridging dots connecting one or more of the plurality of horizontal metal lines to one or more of the plurality of vertical metal segments, wherein locations of the bridging dots determine logic functions of resulting transistor cells.

Additional aspects include forming the plurality of horizontal metal lines and the plurality of vertical metal segments through DSA chemical epitaxy with lamellae-forming block copolymers. Another aspect includes forming the bridging dots above the metal layer through DSA graphoepitaxy with cylinder and/or sphere-forming block copolymers. Yet another aspect includes forming holes within the metal layer by ultra high-resolution lithography corresponding to the locations of the bridging dots; and filling the holes with metal forming the bridging dots within the metal layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 1A through 5C schematically illustrate methods for forming a standard transistor layout using DSA pre-patterns with a complementary metal fabric layer for planar and fin field effect transistor (FinFET) technologies, with FIGS. 1C through 5C illustrating corresponding DSA pre-pattern designs, in accordance with exemplary embodiments;

FIGS. 6A through 6D schematically illustrate exemplary transistor cells formed by using DSA pre-patterns with a complementary metal fabric layer.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of limits in current lithography techniques attendant upon manufacturing semiconductor layout designs for 20 nm technology nodes and beyond. In accordance with embodiments of the present disclosure, DSA pre-patterns are used in conjunction with a standard metal layer and varying locations of bridging dots to generate various transistor cells from the same patterns.

Methodology in accordance with an embodiment of the present disclosure includes forming a standard transistor layout up to the initial vertical interconnect access (VIA) layer (e.g., V0) using DSA pre-patterns. Next, a metal layer is formed over the standard transistor layout. The metal layer includes a plurality of horizontal metal lines and a plurality of vertical metal segments discontinuous from and between adjacent horizontal metal lines. One or more bridging dots are formed connecting one of the plurality of horizontal metal lines to one of the plurality of vertical metal segments. By forming the bridging dots according to specific locations within the metal layer, the locations of the bridging dots determine logic functions of the resulting transistor cells. The standardization of the transistor layout using the DSA pre-patterns in conjunction with the metal layer and the bridging dots allows for implementing DSA in forming semiconductor devices.

Figure 1B:
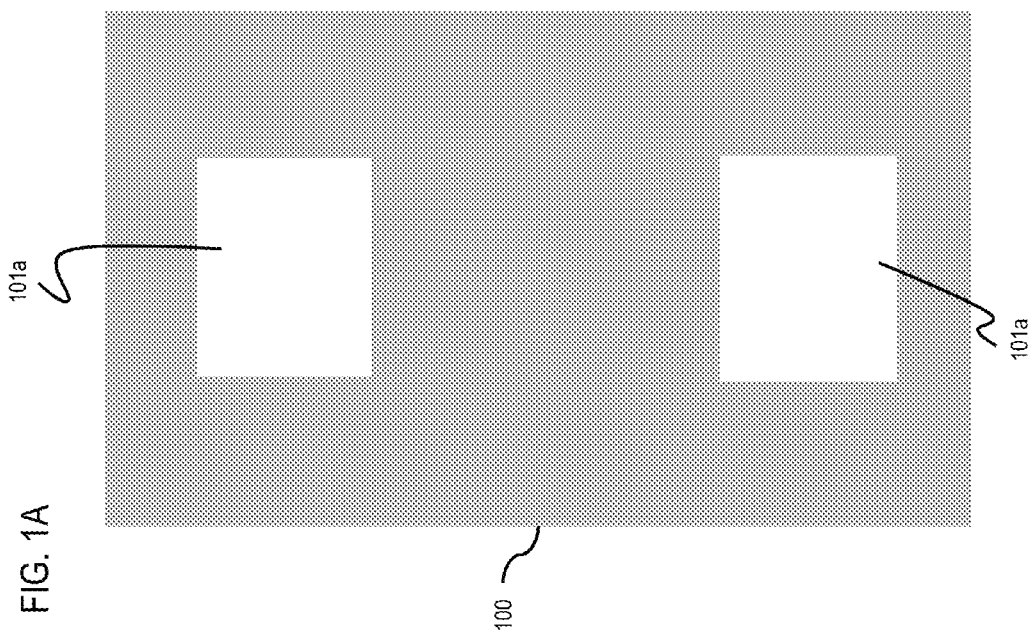
Figure 1A:
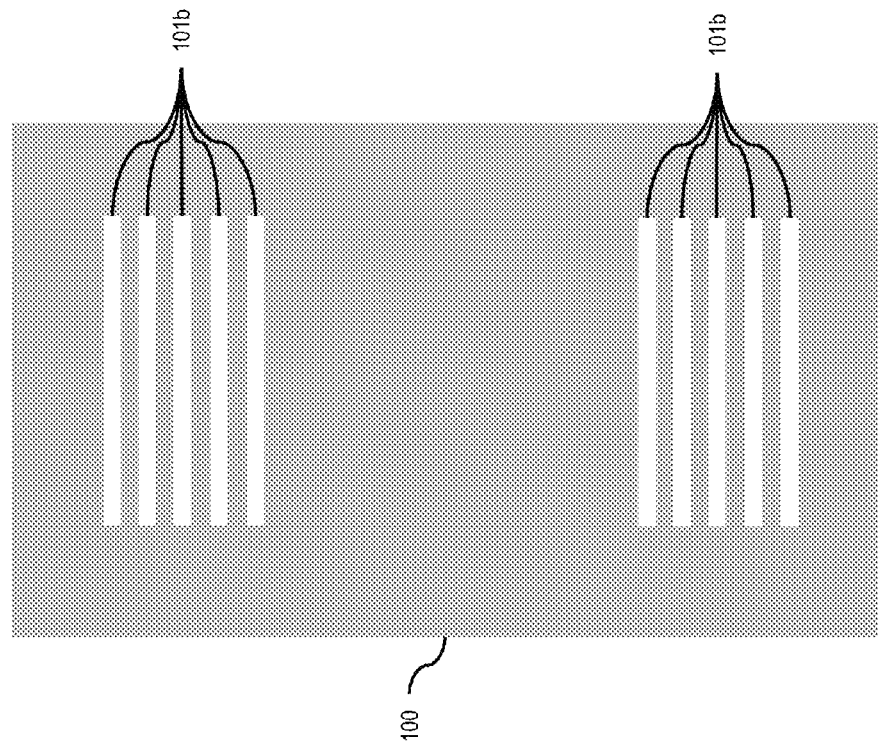

Adverting to FIG. 1A, a method for forming a DSA pre-patterned semiconductor transistor layout, according to an exemplary embodiment, begins with a substrate 100 formed of silicon (Si). Within the substrate 100a are two active regions 101a, as illustrated. The active regions 101a may be for p-type FETs and/or n-type FETs. Further, as illustrated in FIG. 1B, the substrate 100 may alternatively have fins 101b that constitute the active region for subsequently forming FinFETs. Similar to above, the fins 101b may be for p-type FinFETs and/or n-type FinFETs. Although only two active regions 101a and sets of fins 101b are illustrated in FIGS. 1A and 1B, the patterns illustrated may repeat any number of times in the horizontal and/or the vertical directions.

Figure 1C:
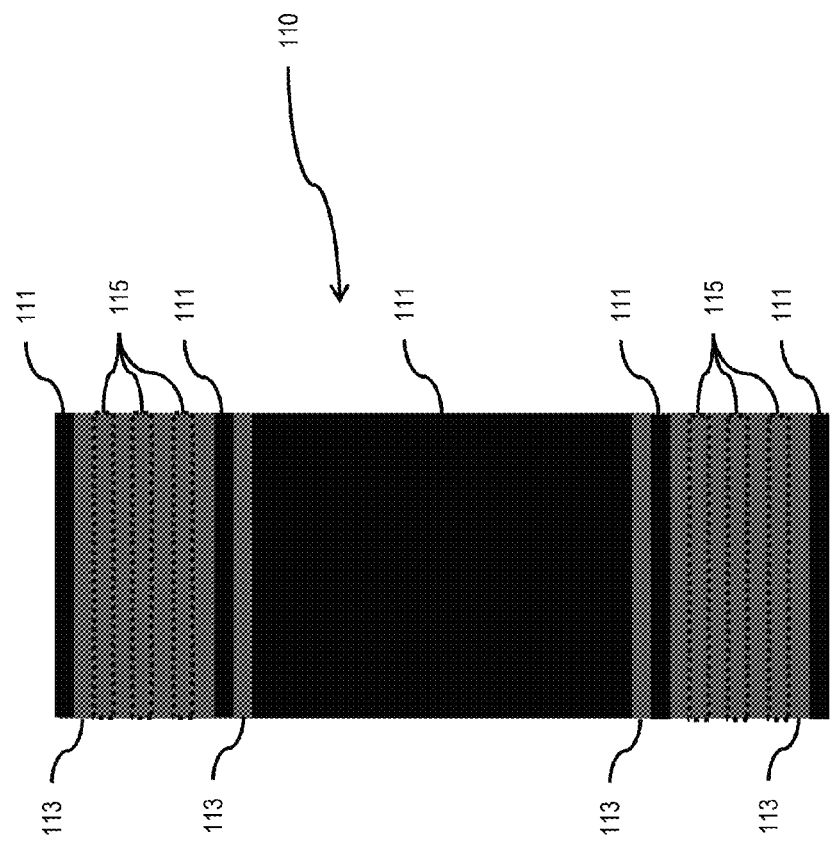

With respect to the fins 101b, the size and/or pitch of the fins may be too small for formation via current lithography techniques. Thus, FIG. 1C illustrates a DSA pre-pattern 110 for forming the fins 101b. The DSA pre-pattern 110 may be configured for DSA via chemical epitaxy with the darker portion 111 representing a chemical layer that is attractive to one of the polymers of a block copolymer used in the DSA, such as poly(methyl methacrylate) (PMMA). The lighter portion 113 may be a neutral surface that is not attractive, or equally attractive, to both of the polymers of the block copolymer, such as the PMMA and polystyrene (PS). The lighter dotted portions 115 represent outlines of the expected structures upon completion of the DSA. As illustrated, the two outlying end segments of the darker portion 111 and the lighter dotted portions 115 representing the expected structure correspond to the five fins of each section of the fins 101b illustrated in FIG. 1B. Although conventional lithography cannot create the pitch of the fins 101b, using lithography to form the outlying end segments of the darker portion 111 in combination with DSA allows for forming the smaller fin size and pitch.

Figure 2B:
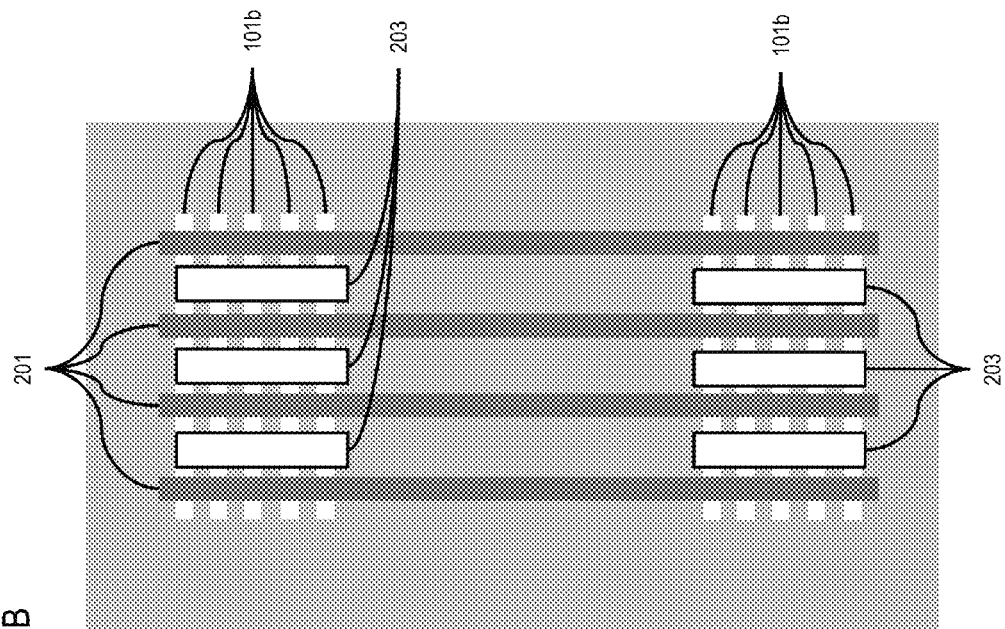
Figure 2A:
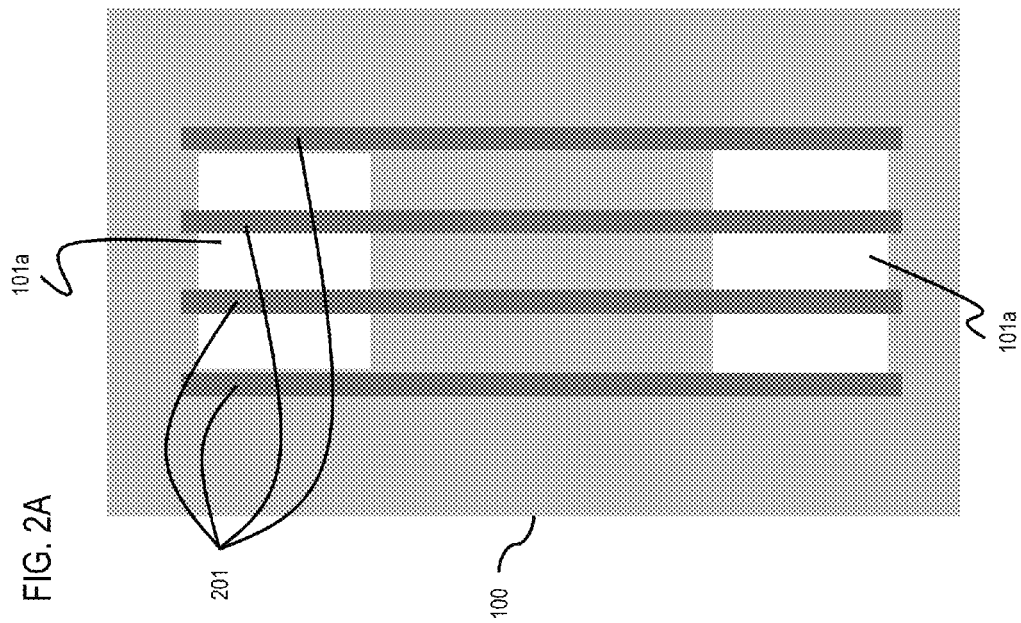

Adverting to FIGS. 2A and 2B, gates 201 are then formed across the active regions 101a and across the fins 101b of FIGS. 1A and 1B. The gates 201 may be formed of any conventional gate material, such as a metal gate over a high-k dielectric. As further illustrated in FIG. 2B, contact bars 203 may be formed between the gates 201 connecting the fins 101b.

Figure 2C:
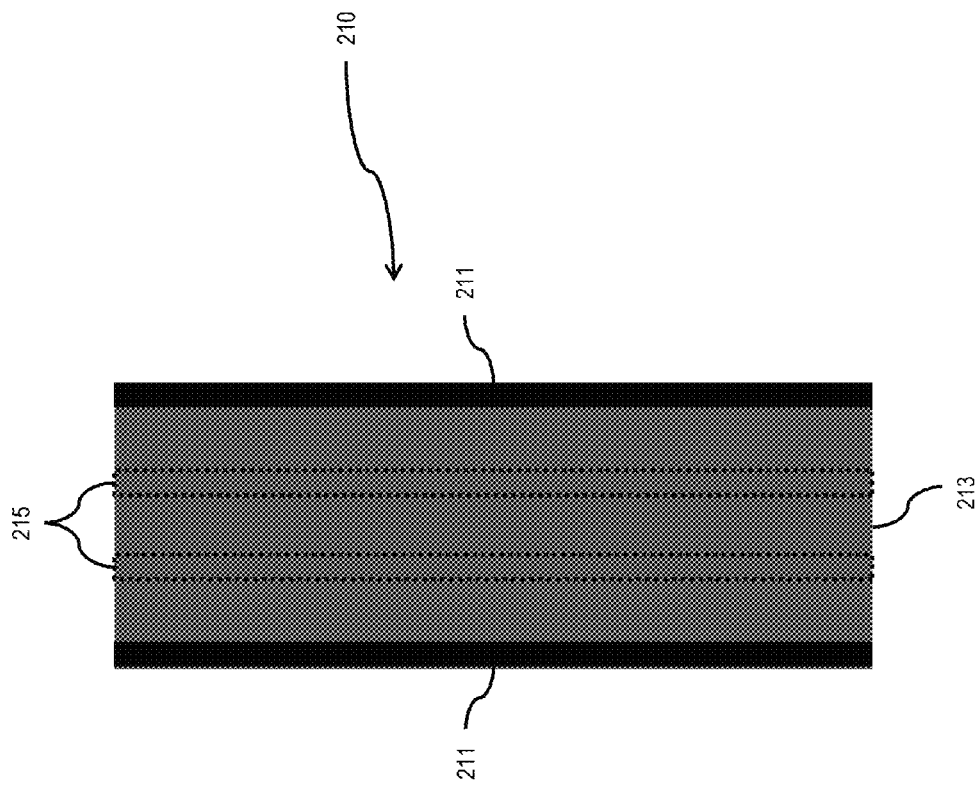

The size and/or pitch of the gates 201 may be too small for formation via current lithography techniques. Thus, FIG. 2C illustrates a DSA pre-pattern 210 for forming the gates 201. The DSA pre-pattern 210 may be configured for DSA via chemical epitaxy with the darker portion 211 representing a chemical layer that is attractive to one of the polymers of the block copolymer used in the DSA (e.g., PMMA). The lighter portion 213 may be a neutral surface that is not attractive, or equally attractive, to both of the polymers of the block copolymer (e.g., the PMMA and PS). The lighter dotted portions 215 represent outlines of the expected structures upon completion of the DSA. As illustrated, the vertical segments of the darker portion 211 and the two lighter dotted portions 215 correspond to the four gates in both FIGS. 2A and 2B. Although conventional lithography cannot create the pitch of the gates 201, using lithography to form the vertical segments of the darker portion 211 in combination with DSA allows for the smaller gate size and pitch. The contact bars 203 may be formed according to a similar process as the gates 201 with respect to DSA in combination with conventional lithography, such as forming the edge contact bars 203 via lithography and the middle contact bars by DSA via chemical epitaxy.

Next, as illustrated in FIG. 3A, contacts 301 and 303 may be formed connecting the gates 201 and the active region 101a to a metal layer that is subsequently formed over the structure (as discussed below). The contacts 301 may connect the gates 201 to the metal layer and the contacts 303 may connect the active region 101a to the metal layer. Further, as illustrated in FIG. 3B, contacts 305 may connect the contact bars 203 to the metal layer. The contacts 301 through 305 may be the initial layer VIAs (e.g., V0).

Figure 3C:
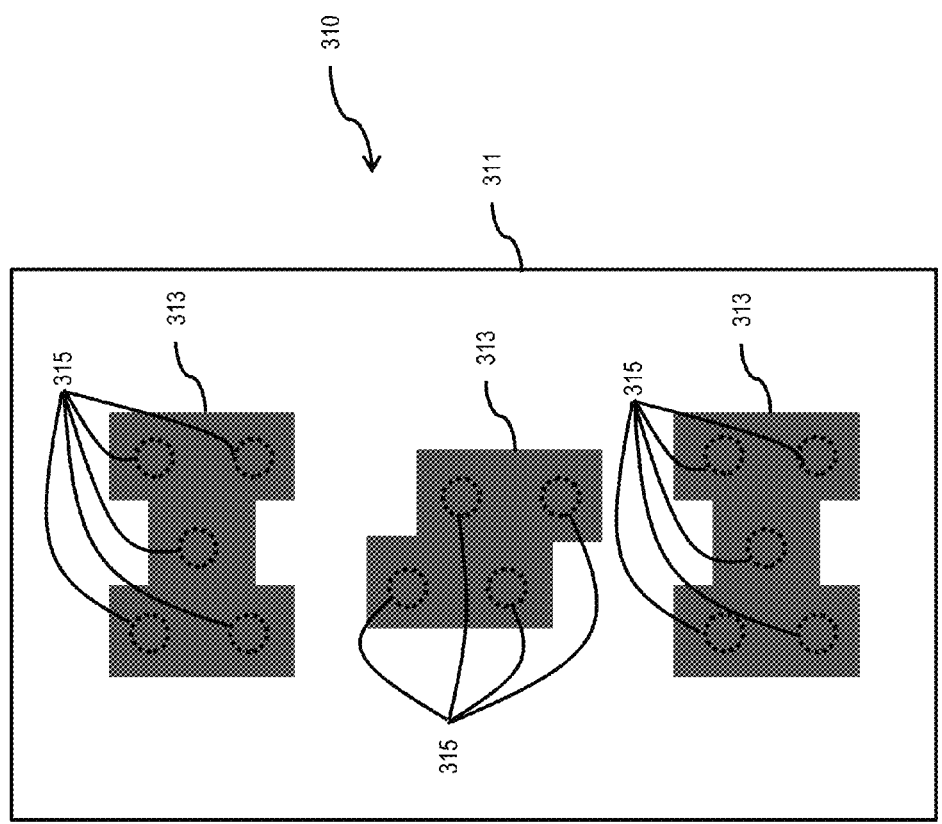

With respect to forming the contacts 301 through 305, the size and/or pitch of the contacts may be too small for formation through current lithography techniques. Thus, FIG. 3C illustrates a DSA pre-pattern 310 for forming the contacts 301 through 305. The DSA pre-pattern 310 may be configured for graphoepitaxy with the portion 311 representing topographical features. The shaded portion 313 may be a neutral surface that is not attractive, or equally attractive, to both of the polymers of the block copolymer, such as PMMA and PS. The dotted portions 315 represent outlines of the expected structures upon completion of the DSA. As illustrated, the dotted portions 315 correspond to the contacts 301 through 305 illustrated in FIGS. 3A and 3B. Although conventional techniques cannot create the size and/or pitch of the contacts, using lithography to form the shape of the topographical features of the portion 311 in combination with DSA of the block copolymer allows for the hexagonal arrangement of the contacts 301 through 305 at a smaller size and pitch.

Adverting to FIGS. 4A and 4B, a metal layer 400 is then formed above and connected to the contacts 301 through 305. The metal layer 400 includes a plurality of horizontal metal lines 401 (i.e., 401a through 401d) and a plurality of vertical metal segments 403. The plurality of horizontal metal lines 401 separates the layout into p-type/n-type FET regions 405 (i.e., 405a and 405b) and input/output regions 407. The p-type/n-type FET regions 405 are interchangeable. As further illustrated, the horizontal metal lines 401 may be grouped into groups of at least four horizontal metal lines 401, with each group defining a transistor cell and including a p-type FET region 405a, an n-type FET region 405b, and an input/output region 407. Further, each group may include a horizontal metal line as a power line (i.e., 401a) and a horizontal metal line as a ground line (i.e., 401d) with horizontal metal lines as intra-cell routing lines and output metal lines therebetween (i.e., 401c and 401b, respectively). The power line 401a and the output metal line 401b may be on opposite sides of a p-FET/n-FET region 405 (i.e., 405a), and the ground line 401d and the intra-cell routing line 401c may be on opposite sides of the p-FET/n-FET region 405 (i.e., 405b).

The vertical metal segments 403 are discontinuous from and between adjacent horizontal metal lines 401. A first row of the vertical metal segments may be aligned with gates 201, as illustrated with respect to the vertical metal segments 403 of the input/output region 407, and second rows of vertical metal segments may be on opposite sides of and adjacent to the first row, as illustrated with respect to the vertical metal segments of the p-FET/n-FET regions 405. Further, the vertical metal segments of the second rows may be misaligned with the gates 201, as illustrated in FIGS. 4A and 4B.

Figure 4C:
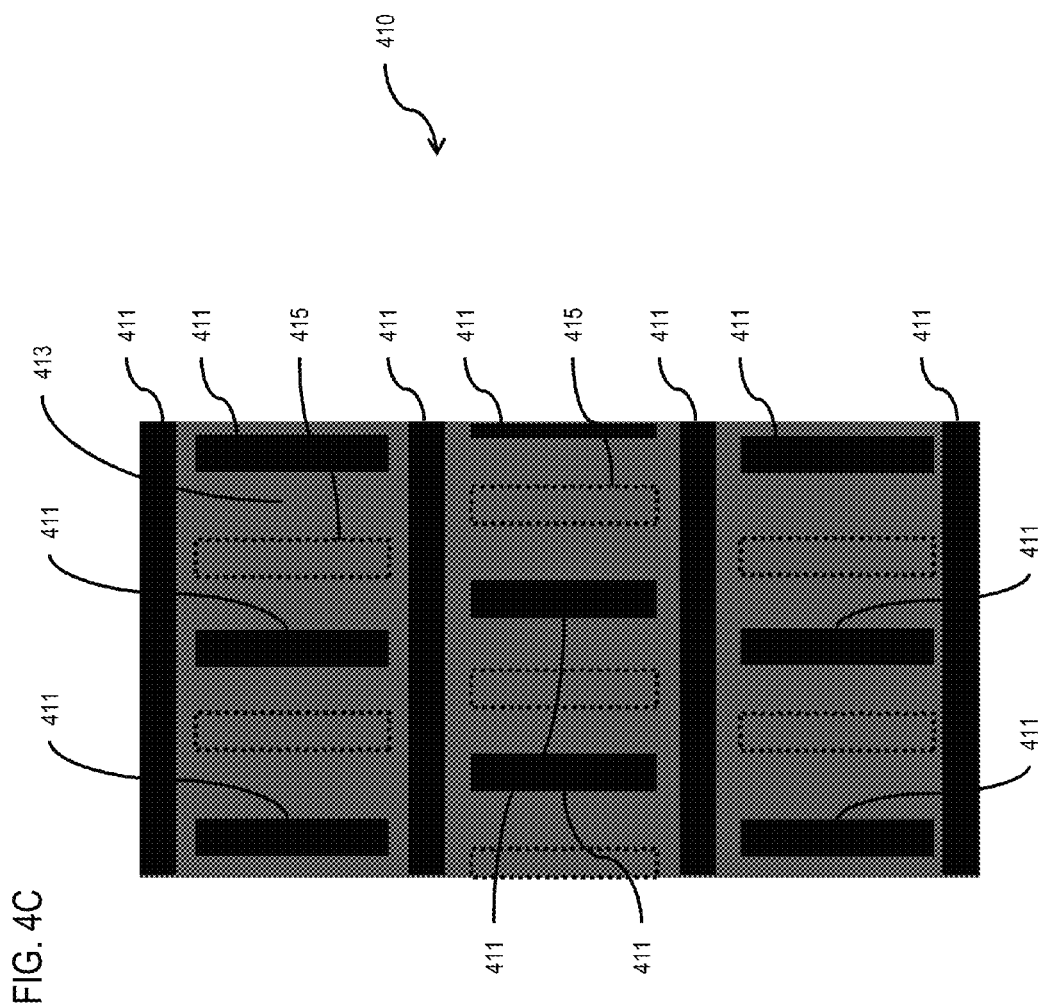

With respect to the vertical metal segments 403, the size and/or pitch of the segments 403 may be too small for formation via current lithography techniques. Thus, FIG. 4C illustrates a DSA pre-pattern 410 for forming the segments 403. The DSA pre-pattern 410 may be configured for chemical epitaxy with the darker portion 411 representing a chemical layer that is attractive to one of the polymers of a block copolymer used in the DSA, such as PMMA. The size and the pitch of the darker portion 411 may be large enough such that the darker portion 411 may be patterned using conventional lithography techniques. The lighter portion 413 may be a neutral surface that is not attractive, or equally attractive, to both of the polymers of the block copolymer, such as PMMA and PS. The lighter dotted portions 415 represent outlines of the expected structures upon completion of the DSA. Although conventional lithography cannot create the pitch of the alternating vertical metal segments 403, using lithography to form the pattern of the darker portion 411 in combination with DSA allows for the smaller pitch of the vertical metal segments 403. As illustrated, the pattern of the darker portion 411 and the lighter dotted portions 415 corresponds to the shape and pitch of the horizontal metal lines 401 and the vertical metal segments 403 in FIGS. 4A and 4B.

Adverting to FIGS. 5A and 5B, one or more bridging dots 501 are formed connecting a horizontal metal line 401 to a vertical metal segment 403. The locations of the bridging dots 501 determine the logic functions of the resulting transistor cells. In FIG. 5A, the locations of the seven bridging dots 501, in combination with the metal layer 400 and the layers below the metal layer 400 results in a two input negated AND or NOT AND (NAND2) transistor cell.

The size and/or pitch of the bridging dots 501 may be too small for conventional lithography formation techniques. Accordingly, FIG. 5C illustrates a DSA pre-pattern 510. The DSA pre-pattern 510 may be configured for graphoepitaxy with the portion 511 representing topographical features and the shaded portion 513 may be a neutral surface that is not attractive, or equally attractive, to both of the polymers of the block copolymer, such as PMMA and PS. The dotted portions 515 represent outlines of the expected structures upon completion of the DSA. As illustrated, the dotted portions 515 correspond to the bridging dots 501 illustrated in FIGS. 5A and 5B. Although conventional techniques cannot create the size and/or pitch of the bridging dots 501, using lithography to form the shape of the topographical features of the portion 511 in combination with the DSA of the block copolymer allows for the hexagonal arrangement of the bridging dots 501.

As discussed above, the locations of the bridging dots 501 determine the logic functions of the resulting transistor cells. The metal layer 400 in combination with the bridging dots 501 are density-multiplying ready and the hexagonal arrangement of the contacts 301 through 305 is to accommodate the hexagonal packing symmetry of cylinder-forming block copolymers, which can be implemented though either DSA graphoepitaxy or chemical epitaxy.

FIG. 6A illustrates a transistor cell identical to the one illustrated in FIG. 5A except for having different locations for the bridging dots 501. Here, the bridging dots 501 are located to form a two input NOR gate (NOR2). Further, FIG. 6B also illustrates a transistor cell identical to the one illustrated in FIG. 5A except for the locations of the bridging dots 501. Here, the bridging dots 501 are located to form a NOT gate.

Figure 6C:
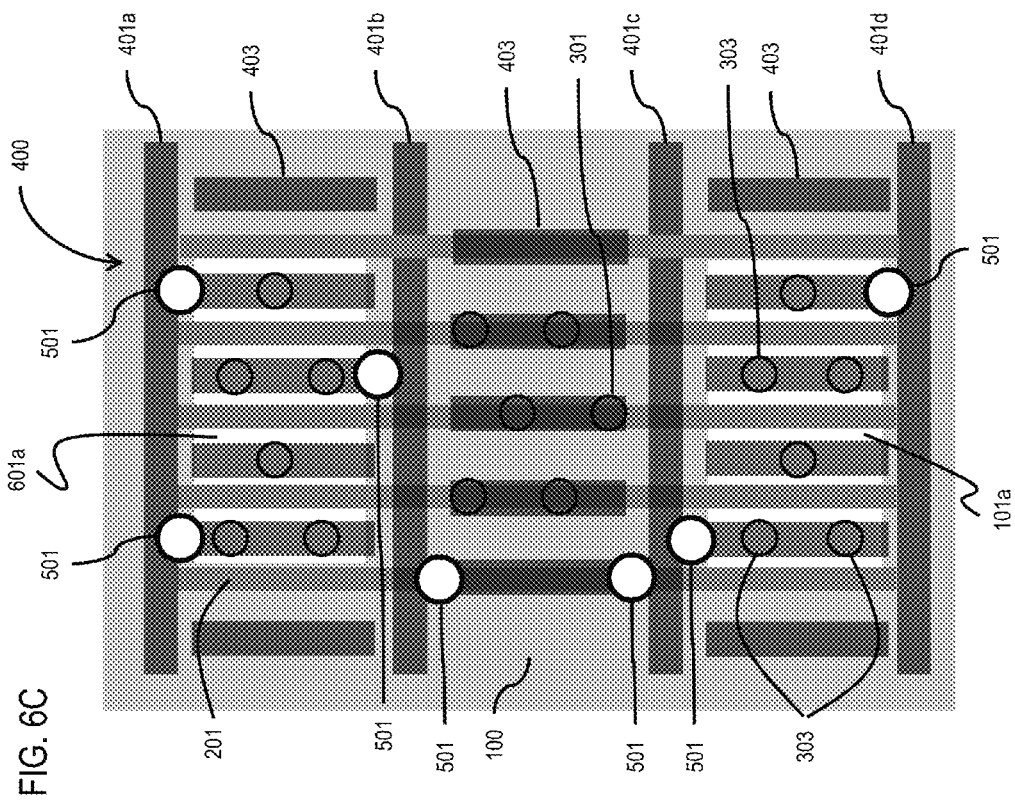
Figure 6D:
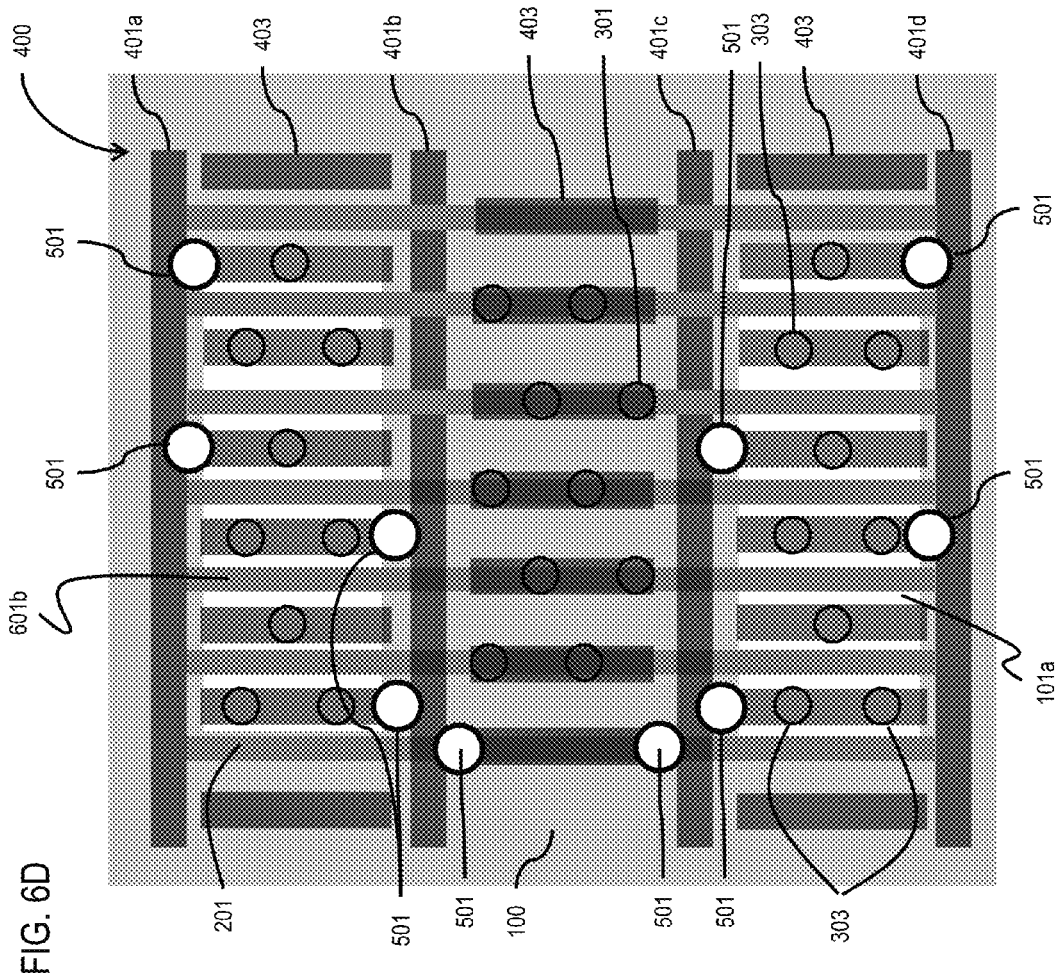

FIGS. 6C and 6D illustrate additional transistor cells with varying logic functions. More specifically, FIGS. 6C and 6D illustrate that the active regions 601a and 601b can be expanded or enlarged compared to the active region 101a in the previous transistor cells to accommodate for different logic functions while still being able to use the DSA pre-patterns for the gates 201, the contacts 301 through 305, the horizontal metal lines 401 and the vertical metal segments 403. Further, the locations of the bridging dots 501 can be changed to change the logic function. Consequently, FIG. 6C illustrates a three input NAND transistor cell based on the locations of the bridging dots 501 and the expanded active region 601a. Further, FIG. 6D illustrates an and-or-invert complex gate transistor cell (AOI22) based on the locations of the bridging dots 501 and the expanded active region 601b. Thus, merely by changing the size of the active region to span additional gates 201, contacts 301/303 and vertical metal segments 403, while also changing the locations of the bridging dots 501, an entirely different transistor cell can be formed using the same DSA pre-patterns.

Figure 7:
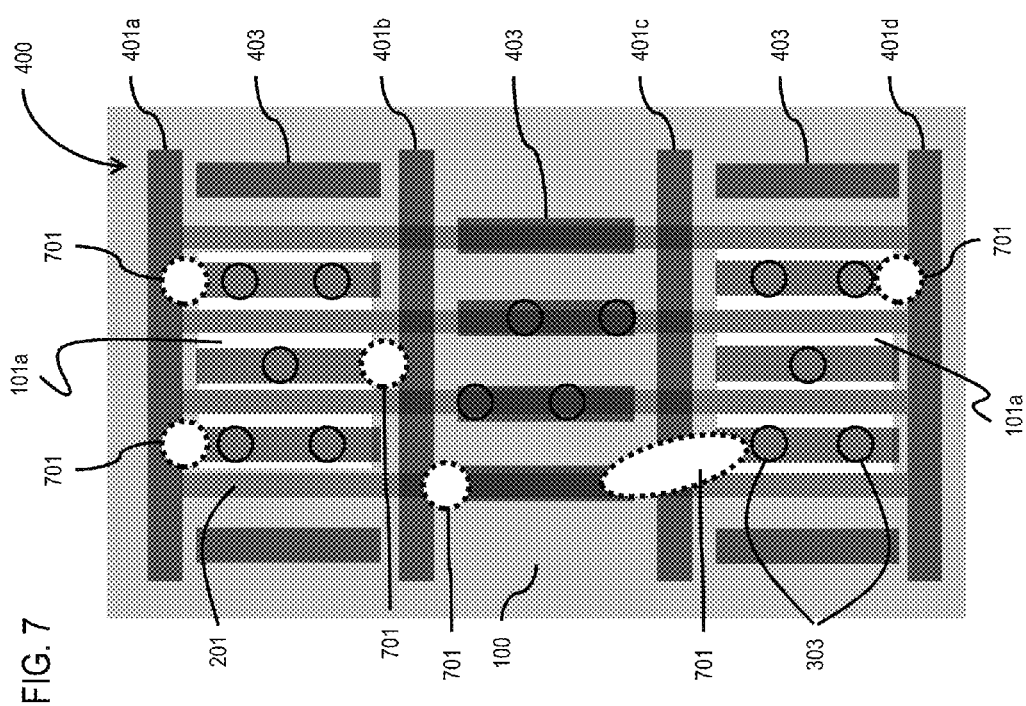
FIG. 7 schematically illustrates a complementary metal fabric layer, in accordance with an alternative exemplary embodiment.

Adverting to FIG. 7, because the bridging dots 501 discussed above are formed after forming the metal layer 400, including the horizontal metal lines 401 and the vertical metal segments 403, the bridging dots 501 are formed above the metal layer 400. Alternatively, the bridging dots 501 may be formed by using EUV lithography to create holes 701 at the locations corresponding to the bridging dots 501. The holes 701 may, therefore, be at the same level as the metal layer 400. After forming the holes 701, the holes may be filled with metal, such as the same metal used to form the metal layer 400, to form bridging dots 501 within the same layer as the metal layer 400.

The embodiments of the present disclosure achieve several technical effects, including enabling a DSA layout that allows for structures with half-pitch as small as 10 nm and beyond while maintaining satisfactory critical dimension uniformity (CDU) and line-edge roughness (LER), which is far beyond the capability of current state-of-the-art 193 nm immersion lithography and superior to many issues facing still developing EUV lithography. The disclosed DSA pre-patterned transistor layout is a one-style-fits-all layout design through use of the metal layer (e.g., MD for enabling the routing needs of most logic functions. The one-style-fits-all solution significantly reduces the complexity of a layout design and related costs for different cells. The layout of the DSA pre-patterns also is without bent structures, such as jogs, which are highly strained structures with respect to polymer physics that would potentially induce defects that would increase manufacturing risks. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
   forming a pre-patterned transistor layout by directed self-assembly (DSA);
   forming a metal layer over the DSA pre-patterned transistor layout, comprising:
      forming a plurality of horizontal metal lines; and
      forming a plurality of vertical metal segments discontinuous from and between adjacent horizontal metal lines;

forming one or more bridging dots each connecting one of the plurality of horizontal metal lines to one of the plurality of vertical metal segments; and forming the bridging dots above the metal layer through DSA graphoepitaxy with cylinder and/or sphere-forming block copolymers, wherein locations of the bridging dots determine logic functions of resulting transistor cells.

2. The method according to claim 1, comprising:
the plurality of horizontal metal lines separating the transistor layout into p-type field effect transistor (p-FET) regions, n-type field effect transistor (n-FET) regions, and input/output regions.

3. The method according to claim 1, further comprising:
dividing the plurality of horizontal metal lines into groups of at least four horizontal metal lines, each group including a power line and a ground line, and intra-cell routing and output metal lines therebetween.

4. The method according to claim 3, comprising:
forming the power line and the output metal line on opposite sides of a p-FET/n-FET region in the transistor layout; and
forming the ground line and the intra-cell routing line on opposite sides of an n-FET/p-FET region in the transistor layout.

5. The method according to claim 1, comprising:
forming a first row of the plurality of vertical metal segments aligned with gates within the transistor layout; and
forming second rows of the plurality of vertical metal segments on opposite sides of and adjacent to the first row, the vertical metal segments of the second rows being misaligned with the gates within the transistor layout.

6. The method according to claim 1, comprising:
forming the plurality of horizontal metal lines and the plurality of vertical metal segments through DSA chemical epitaxy with lamellae-forming block copolymers.

7. The method according to claim 1, comprising:
forming holes within the metal layer by ultra high-resolution lithography corresponding to the locations of the bridging dots; and
filling the holes with metal forming the bridging dots within the metal layer.

8. A method comprising:
forming a pre-patterned transistor layout, comprising:
forming transistors over an active region in a substrate through directed self-assembly (DSA) chemical epitaxy of a block copolymer; and
forming contacts extending up from the active region and the transistors through DSA graphoepitaxy of the block copolymer;
forming a metal layer over the transistors and connected to the contacts, comprising:
forming a plurality of horizontal metal lines; and
forming a plurality of vertical metal segments discontinuous from and between adjacent horizontal metal lines; and
forming one or more bridging dots connecting one or more of the plurality of horizontal metal lines to one or more of the plurality of vertical metal segments,
wherein locations of the bridging dots determine logic functions of resulting transistor cells.

9. The method according to claim 8, comprising:
forming the plurality of horizontal metal lines and the plurality of vertical metal segments through DSA chemical epitaxy with lamellae-forming block copolymers.

10. The method according to claim 8, comprising:
forming the bridging dots above the metal layer through DSA graphoepitaxy with cylinder and/or sphere-forming block copolymers.

11. The method according to claim 8, comprising:
forming holes within the metal layer by ultra high-resolution lithography corresponding to the locations of the bridging dots; and
filling the holes with metal forming the bridging dots within the metal layer.

* * * * *